United States Patent
Murayam et al.

[11] Patent Number: 5,215,788
[45] Date of Patent: Jun. 1, 1993

[54] COMBUSTION FLAME METHOD FOR FORMING DIAMOND FILMS

[75] Inventors: Motohide Murayam; Shinji Kojima; Katsuyuki Ohsawa; Shoji Noda; Kiyoshi Uchida, all of Aichi, Japan

[73] Assignee: Kabushiki Kaisha Toyota Chuo Kenkyusho, Aichi, Japan

[21] Appl. No.: 718,986

[22] Filed: Jun. 21, 1991

[30] Foreign Application Priority Data

Jul. 6, 1990 [JP] Japan ................................ 2-180159
Jan. 21, 1991 [JP] Japan ................................ 3-005355

[51] Int. Cl.⁵ .............................................. B05D 1/08
[52] U.S. Cl. .................................... 427/450; 427/446; 427/122; 427/249; 427/314; 423/446
[58] Field of Search ................ 427/423, 34, 122, 249, 427/314, 450, 446; 423/446; 431/158; 239/299, 290, 11; 219/121.47, 121.59, 76.16

[56] References Cited

U.S. PATENT DOCUMENTS

548,630 10/1942 Blount et al. ........................ 427/423
3,526,362 9/1970 Jackson et al. ..................... 239/290
4,938,940 7/1990 Hirose et al. ...................... 423/446

FOREIGN PATENT DOCUMENTS

1-282193 11/1989 Japan .
2-267193 10/1990 Japan .

OTHER PUBLICATIONS

Rhys-Jones et al., "Applications of thermally sprayed coating systems in Aero Engines", The 12th Int. Conf. on Thermal Spraying (London, UK) Jun. 1989, FIG. 1.

Primary Examiner—Michael Lusigan
Assistant Examiner—Roy V. King
Attorney, Agent, or Firm—Jacobson, Price, Holman & Stern

[57] ABSTRACT

When a mixture of gases containing carbon is burned to form a film of diamond on a surface of a substrate held at an appropriate temperature, it is so burned as to form a substantially flat region of incomplete combustion lying in parallel to the substrate surface and contacting it, while the region is surrounded by an air-shielding gas stream or formed under a reduced pressure.

12 Claims, 7 Drawing Sheets

1.39μ

1.39μ

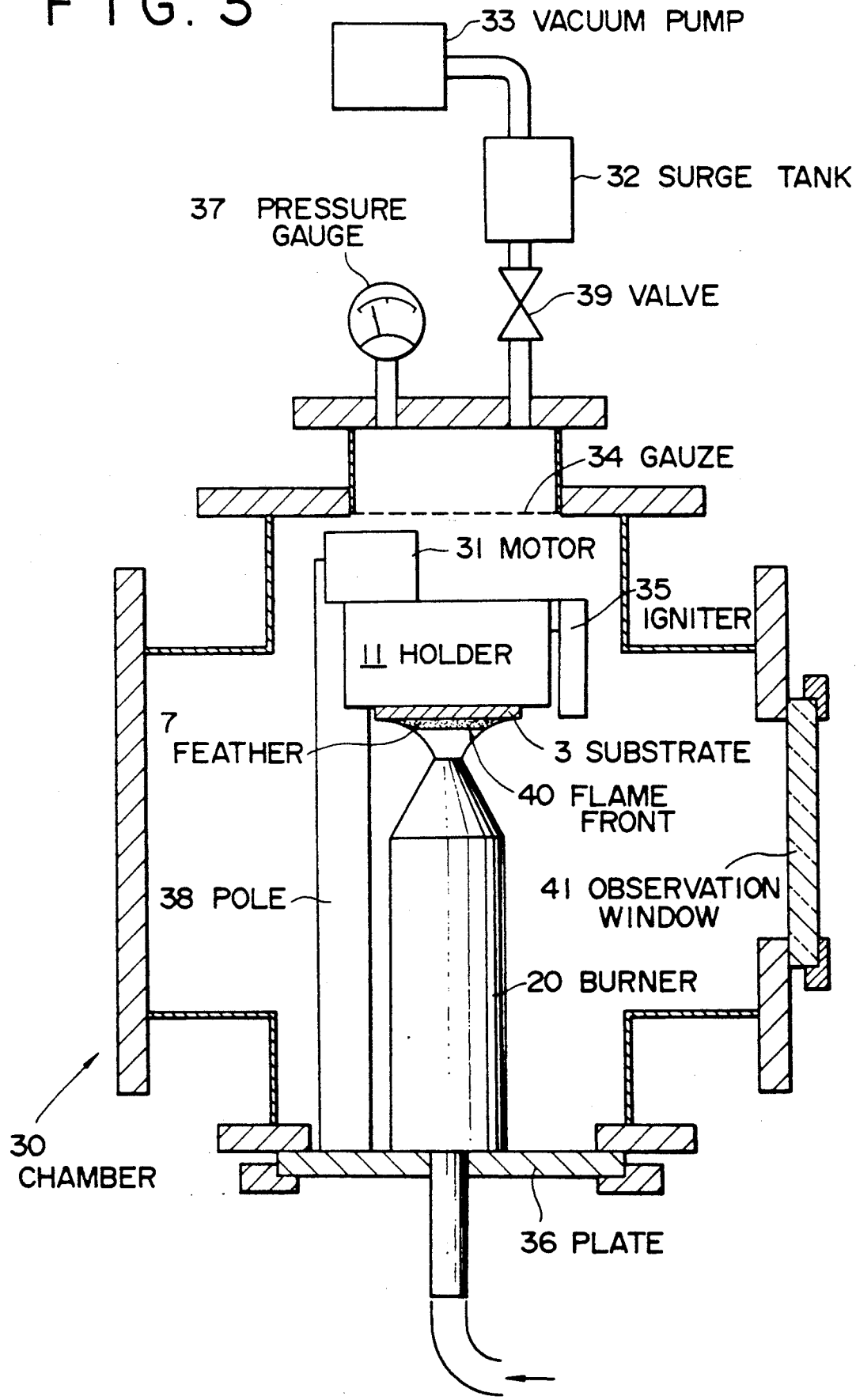

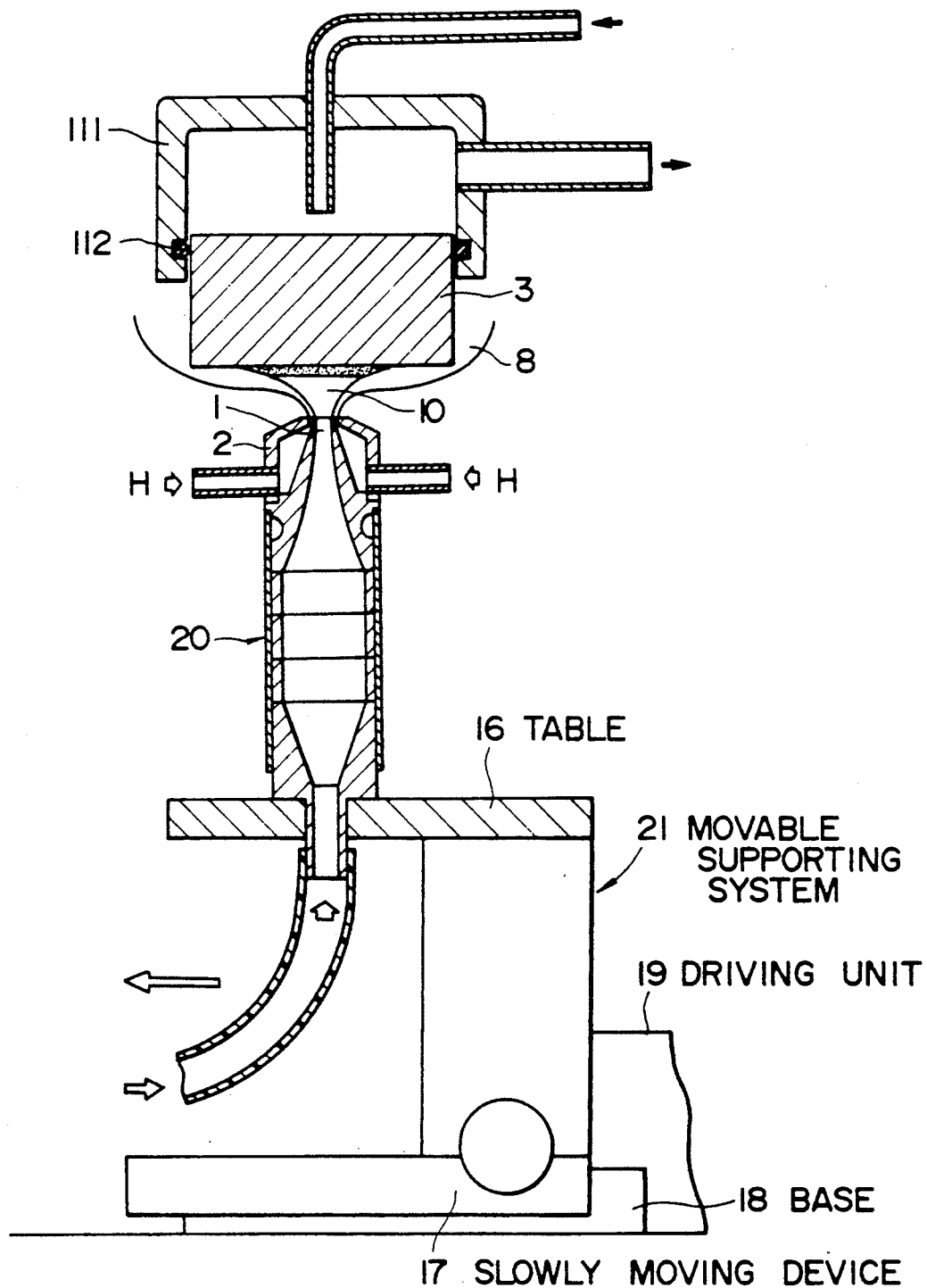

COMBUSTION FLAME METHOD FOR FORMING DIAMOND FILMS

BACKGROUND OF THE INVENTION

1. Field of the Invention

This invention relates to a method of, and an apparatus for, forming a film of diamond on a substrate by vapor deposition.

2. Description of the Related Art

According to recently known methods for the synthesis of diamond by low-pressure chemical vapor deposition (CVD), a gaseous mixture of a hydrocarbon, or organic compound containing nitrogen, oxygen, etc., and hydrogen is excited by a hot filament, a microwave, high-frequency, or direct current (DC)-discharge plasma, a DC arc discharge, etc. Japanese Patent Application Laid-Open No. 282193/1989 discloses a method which causes diamond to be deposited on a substrate placed in the incomplete combustion region of an oxyacetylene flame which is called an acetylene feather.

The burner which is employed by these methods, however, produces a conical flame which fails to give a gas stream having a uniform temperature distribution. The resulting active seeds lack uniformity in density and fail to form a homogeneous film of diamond.

SUMMARY OF THE INVENTION

Under these circumstances, and in view of the fact that a method using a flame of combustion is easier to carry out than any other method based on CVD, and has a higher film-forming speed, it is an object of this invention to provide an improved method which can form a homogeneous film of diamond. It is another object of this invention to provide an apparatus for carrying out the method of this invention.

The method of this invention comprises burning a mixture of materials containing carbon so as to form a region of incomplete combustion, placing a substrate in the region, and maintaining the substrate at an appropriate temperature to form a film of diamond on the substrate, characterized in that the region of incomplete combustion is substantially in the shape of a flat shape and is surrounded by an air-shielding gas stream.

The apparatus of this invention comprises a main nozzle for injecting a main stream consisting of a gaseous mixture of materials containing carbon, an auxiliary nozzle for injecting an air-shielding gas stream surrounding the main stream, and a holder for holding a substrate opposite the main nozzle and maintaining the substrate at an appropriate temperature to form a film of diamond. The gaseous mixture of materials is burned so as to form (between the substrate and the main nozzle) a region of incomplete combustion shaped substantially in the form of a flat shape and surrounded by the air-shielding gas stream, whereby a film of diamond is formed on the surface of the substrate which is exposed to the region of incomplete combustion.

The most salient feature of the method according to this invention resides in the formation of a substantially flat inner flame facing the substrate to thereby realize a field in which active seeds for diamond are formed in a uniform density. If a mixture of acetylene and oxygen is, for example, used as the gaseous mixture of materials, therefore, hydrogen is added to the mixture to lower its rate of combustion, and the inner flame is shielded from the surrounding air so as to rise from the edge of a burner.

If a uniform stream of fluid impinges upon a flat plate, a stagnant region is usually formed ahead of the plate. The stream decreases its velocity and, therefore, becomes stabler, as it approaches the plate. If combustible gas is burned in the stagnant region, it forms a flat flame lying in parallel to the plate. It is known that the position of the surface of the flame depends on a balance between the rate of combustion of the gas and the component of its flow velocity in the direction normal to the flame front, and that its stability depends on the composition of the mixed gas and its stretching rate.

As a mixture of acetylene and oxygen burns very rapidly, it is necessary to raise its flow velocity to prevent any backfire. This, however, brings about so high a stretching rate in a stagnant region that the flame is blown away and loses stability. Therefore, hydrogen is added to the mixture to lower its burning velocity to form a flame which is now blown away. As the mixture which is burned has an excessively high concentration of acetylene as represented by an equivalent ratio of at least 2.5, its diffusion with the air forms an outer flame at the outlet of the burner and the inner flame adheres to the edge of the burner. Therefore, the main stream is surrounded by the air-shielding gas stream to form a flat flame raised from the edge of the burner and positioned ahead of the substrate. The flat flame creates a field having a uniform density of active seeds for diamond in a substantially flat region of incomplete combustion ahead of the substrate, and thereby enables the formation of a homogeneous film of diamond on the substrate. In order to maintain the stability of the flat flame, it is advisable to rectify the main stream which is supplied to the flame to form the film. This rectification enables a uniform flow of the stream and thereby the formation of a stable flat flame. The uniform flow velocity of the main stream at the injection port thereof gives a high velocity gradient at the edge of the burner and thereby enables the inner flame to rise easily.

A conventional welding burner forms a conical inner flame, a region of incomplete combustion (feather) surrounding it, and an outer flame formed around the feather as a result of its diffusion with the air. The formation of diamond occurs in the feather. The active seeds which are formed in the feather, however, lack uniformity in density, since the feather is likely to have a higher concentration of hydrogen in its central portion as a result of the selective diffusion from the conical inner flame, and since the diffusion from the outer flame is likely to cause on the outer surface of the feather a reaction which consumes active seeds. Therefore, the use of the conventional burner fails to produce any homogeneous film of diamond that is comparable to the product of this invention.

Hydrogen is most desirably added to the mixture of acetylene and oxygen forming the main stream. It not only lowers the burning velocity of the mixture to form a stable flat flame, but also exhibits an etching effect by reacting with, and removing, any graphite or amorphous carbon that may be precipitated with diamond. Thus, the addition of hydrogen contributes also to improving the quality of the diamond film which is formed.

The mixture preferably has an acetylene to oxygen ratio by volume of 1.0 to 1.2, and a hydrogen to oxygen ratio by volume of 1 or below 1. In order to form diamond of still better quality, it is advisable to burn a mixture having a carbon to oxygen atom ratio, of 1.0 to 1.1, and containing a lower proportion of hydrogen to attain a flame temperature of at least about 3000°K. If no hydrogen is added, it is desirable to add a saturated hydrocarbon, such as methane, ethane or propane, since it readily gives a hydrogen radical.

The air-shielding gas stream is preferably composed of combustible gas, such as hydrogen. The combustion of combustible gas forms a spreading flame which covers the main stream and consumes the oxygen in the air to prevent it completely from entering the main stream. The spreading flame gives rise to an elevated temperature around the main stream, raises its kinematic viscosity, and thereby ensures that the main stream flow stably without having any turbulence. It is also possible to use an inert gas, such as nitrogen or argon, if it can prevent any oxygen in the air from entering the main stream.

The substrate may be made of a material to which diamond easily adheres, for example, an ultrahard alloy, silicon, silicon carbide, alumina, tungsten, or molybdenum. The substrate is supported by a holder and is maintained at a temperature which is appropriate for causing diamond to be deposited on the substrate.

The apparatus of this invention comprises the main nozzle for injecting the main stream, the auxiliary nozzle for injecting the air-shielding gas stream surrounding the main nozzle, and the holder for holding the substrate.

The main nozzle has an upstream portion provided with a diffuser and a damping chamber whereby the gaseous mixture forming the main stream is rectified. The damping chamber is provided with a plurality of wire nets, beads, or honeycombs which rectify the gaseous mixture into a uniform stream.

The auxiliary nozzle has an end opening surrounding that of the main nozzle, and injects a gas stream which covers the main stream completely.

The substrate is so supported as to have a surface positioned at right angles to the longitudinal axis of the burner, so that a flat flame may be formed ahead of the substrate surface to define a feather in which the substrate is held. The holder is provided with a device for controlling the temperature of the substrate.

In order to form a stable flat flame, it is advisable to ensure that the diameter, D, of the end opening of the main nozzle and the distance, L, between the end of the main nozzle and the substrate have the following relationship:

$$0.1 \cdot D < L < 10 \cdot D.$$

If the distance L is equal to, or less than, 0.1·D, there is no ample space left for a flat flame. If the distance L exceeds 10·D, the mixing of the main stream and the stream surrounding it gives rise to a flat flame lacking stability and resulting in a film lacking uniformity. The distance L is preferably at least 0.25·D. If it is less than 0.25·D, an annular flame is formed, and the impingement of a stream of unburned gas upon the substrate disables the formation of any film in its central portion.

That surface of the substrate which is contacted by the feather may not only be a flat one, but may also be a cylindrical, or spherical one. A film can be formed on a curved, or uneven surface if at all a flat flame can be produced.

The substrate is preferably controlled to a temperature of about 800° C. when a film is formed. The holder is preferably provided with a device for cooling the rear surface of the substrate to maintain a temperature of 800° C. to 900° C. on the front surface of the substrate on which a film is formed.

The apparatus may be used to form a film in a chamber having a reduced pressure, or in an atmospheric environment. The use of a chamber having a reduced pressure is, however, preferred, since at a reduced pressure, the chemical equilibrium changes in the direction allowing for an increase of radicals.

It is possible to form a film of diamond over an enlarged area if the devices for supplying the gases are moved horizontally at a constant speed to cause the feather to move along the substrate, while the air-shielding gas stream covers the substrate and burns to prevent any oxygen from reaching the substrate surface and causing the oxidation of the film formed thereon. If the main nozzle is provided with a porous plate, it is possible to extinguish any backfire occurring from the inner flame, or prevent its propagation.

The method of this invention can form a stable flat flame in the stagnant stream formed ahead of the substrate and surrounded by the air-shielding gas stream. The flat flame forms a region of incomplete combustion which can produce a field having a uniform temperature and a uniform density of active seeds for diamond, as opposed to what can be achieved by any conventionally formed flame. The air-shielding gas stream covering the main stream enables the formation and maintenance of a uniform feather, and thereby the formation of a homogeneous film of diamond. Moreover, the method can form the film at an extremely high speed in the order of about 100 microns per hour and the film is comparable in quality to the product of any conventional CVD process having a film-forming speed of only several microns per hour.

The method of this invention can form a stable feather, as it is surrounded by the air-shielding gas stream. Therefore, the active seeds which are formed in the feather are uniform in density and form a homogeneous film of diamond.

The apparatus of this invention makes it possible to alter the position of a flat flame and the area covered by it and thereby form a large film of diamond if the flow velocity and composition of the gaseous mixture and the distance between the substrate and the nozzle are appropriately controlled.

BRIEF DESCRIPTION OF THE DRAWINGS

FIG. 3 is a schematic elevational view, partly in section, of still another apparatus embodying this invention.

FIG. 7 is a schematic elevational view, partly in section, of a system attached to the apparatus embodying this invention for moving it.

DESCRIPTION OF THE PREFERRED EMBODIMENTS

The invention will now be described more specifically with reference to several examples thereof.

EXAMPLE 1

Figure 1:
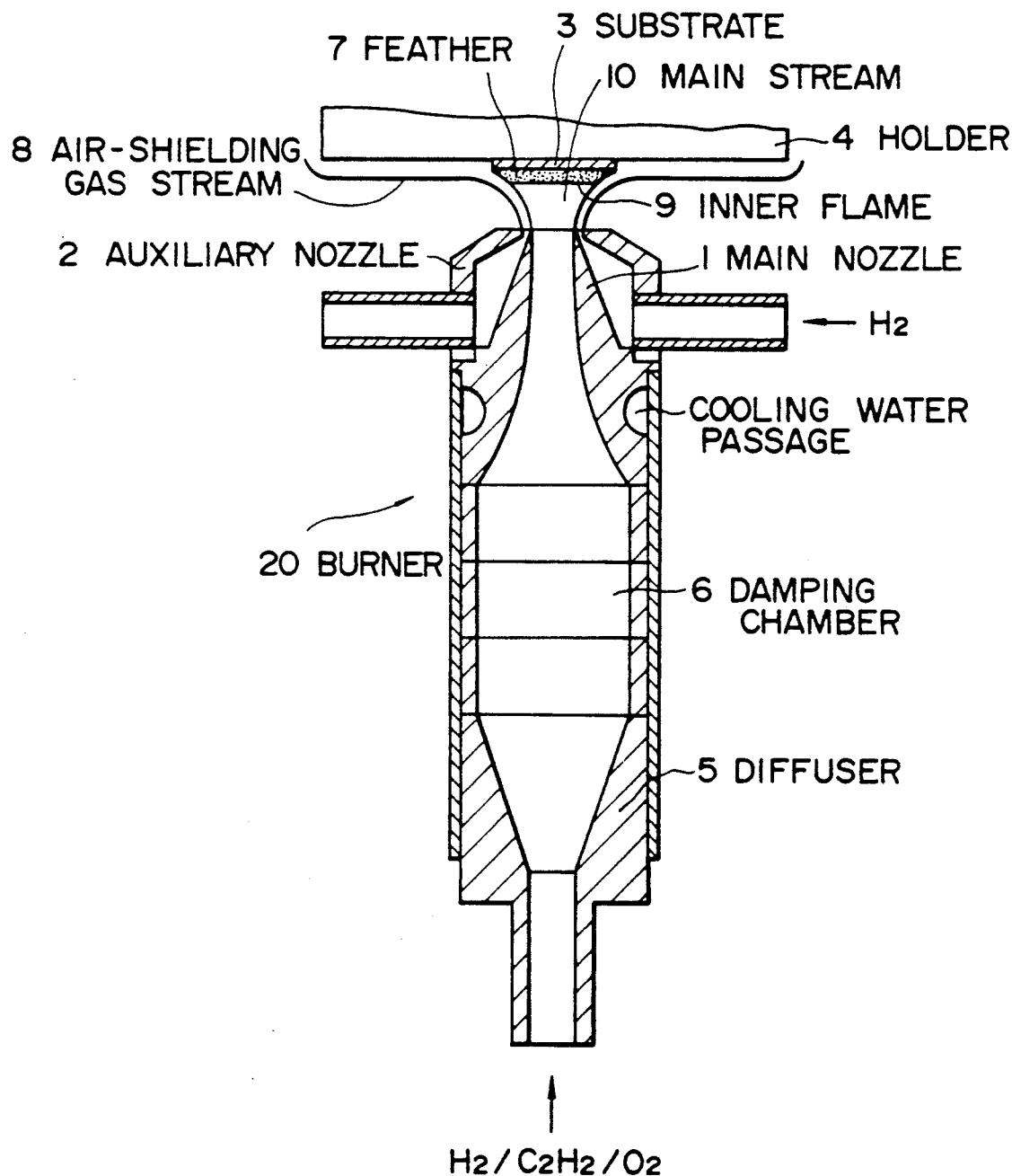
FIG. 1 is a schematic longitudinal sectional view of an apparatus, embodying this invention.

Reference is made to FIG. 1 showing an apparatus embodying this invention. It comprises a burner 20, a substrate 3, and a holder 4 for holding the substrate 3.

The burner 20 is generally axisymmetric, and comprises a main nozzle 1 having in the top center of the burner an opening through which a gaseous mixture is injected to form an inner flame 9 when it is burned, and an auxiliary nozzle 2 having about the top of the main nozzle 1 an annular opening through which a gas is injected to form an air-shielding gas stream 8 surrounding a main stream 10 formed by the gaseous mixture injected through the main nozzle 1. The gaseous mixture is introduced into the burner 20 at its bottom, has its flow velocity reduced by a cylindrical diffuser 5, and is rectified in a damping chamber 6 provided with a plurality of wire nets for rectifying the stream of the gaseous mixture, before it is injected through the main nozzle 1. The gas forming the air-shielding gas stream 8 is supplied into the auxiliary nozzle 2 through a pair of pipes connected to the burner 20. The burner 20 is provided with a passage through which cooling water is circulated to cool the nozzles to protect them against any abnormal rise in temperature.

The substrate 3 is held by the holder 4 above the main nozzle 1 at right angles to the longitudinal axis thereof. The main stream 10 is injected against the substrate 3 to form the inner flame 9 having a flat shape ahead of the substrate 3 and thereby a feather 7 containing active seeds for diamond between the substrate 3 and the inner flame 9.

The substrate 3 is made of silicon and is bonded to the holder 4 with a silver paste. The holder 4 is provided with a cooling device, not shown, which controls the substrate 3 to a temperature of about 800° C. which is appropriate for the formation of a film of diamond.

Figure 2A:
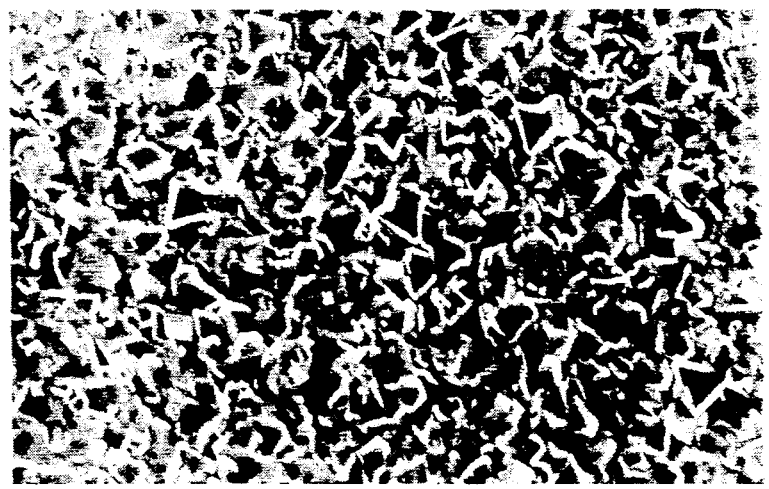
FIGS. 2(a) and 2(b) are scanning electron micrographs (SEM) of a diamond film formed on the surface of a substrate.
Figure 2B:
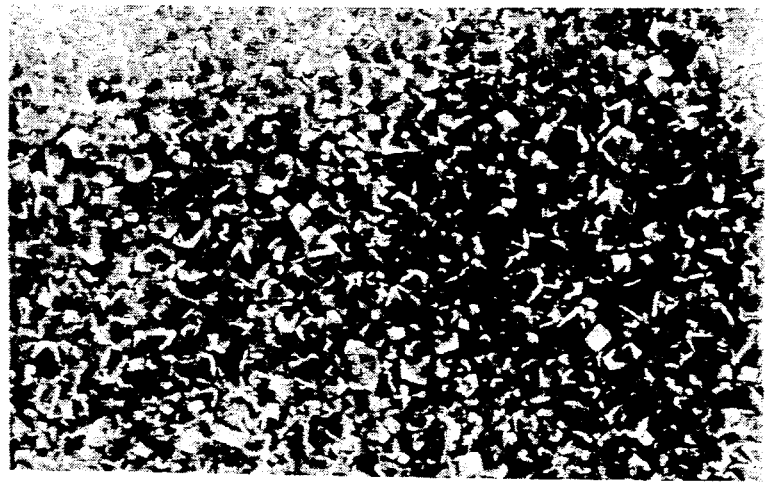

The apparatus as hereinabove described was used for forming a film of diamond in the open air. The main nozzle 1 had a diameter of 3 mm at its end opening, the annular opening of the auxiliary nozzle 2 had an outside diameter of 5 mm, and the substrate 3 was held at a distance of 4.5 mm from the nozzle 1. The main stream 10 was of a mixture of hydrogen supplied at a flow rate of 2.8 liters per minute, acetylene supplied at a flow rate of 4.9 liters per minute, and oxygen supplied at a flow rate of 4.3 liters per minute, while the air-shielding gas stream 8 was of hydrogen supplied at a flow rate of 3.0 liters per minute. When the main stream 10 was burned to form a flat flame, it formed a disk-shaped feather 7 having a diameter of 7 mm. The surface of the substrate 3 was held at a temperature of about 800° C., and the film-forming operation was continued for 15 minutes. The examination of the substrate surface confirmed the presence of a circular homogeneous film of diamond having a diameter of 7 mm. The results are shown in FIG. 2. FIGS. 2(a) and 2(b) are scanning electron micrographs of the central portion and of the peripheral portion 4 mm from the center of the film surface, respectively.

EXAMPLE 2

The apparatus which had been used in EXAMPLE 1 was modified for installation in a vacuum vessel, as shown in FIG. 3. The vessel 30 is a stainless steel vessel of the gastight pressure-resistant construction and is mounted on a support not shown. A vacuum pump 33 is provided for drawing gas out of the vessel 30 through a surge tank 32 to establish a reduced pressure in the vessel 30. The pressure of the vessel 30 is monitored by a pressure gauge 37. The burner 20 is secured to a plate 36 and is supplied with a gaseous mixture at its bottom. The substrate 3 is bonded with a silver paste to the bottom of a holder 11 containing a cooling device. The holder 11 is so supported as to be horizontally rotatable by a motor 31 which is supported by a pole 38 secured to the plate 36. The observation window 41 is provided with a radiation pyrometer to monitor the temperature of the substrate 3.

The plate 36 is removable from the vessel 30. The burner 20 is ignited to form a flame before the apparatus is placed in the vessel 30. The distance between the substrate 3 and the burner 20 is adjusted to form a feather 7 on the surface of the substrate 3. Then, the vacuum pump 33 is started to draw gas out of the vessel 30 and the plate 36 is connected to the vessel 30 in a gastight fashion by bolts not shown, while the amount of the gas which is drawn out is controlled by a valve 39 in accordance with the pressure monitored by the pressure gauge 37.

When a film-forming operation is to be ended, the motor 31 is driven to rotate the holder 11 and thereby the substrate 3 horizontally to move the substrate 3 away from the flame instantaneously, whereby it is possible to prevent the re-combustion of a film and its contamination with impurities, such as soot.

The burner 20 including the nozzles, and the substrate 3 are of the same construction as has already been described with reference to FIG. 1.

The main nozzle 1 had a diameter of 5 mm, while the annular opening defined by the auxiliary nozzle 2 had an outside diameter of 7 mm, and the main nozzle 1 and the substrate 3 had a distance of 10 mm therebetween. The main stream 10 was of a mixture of hydrogen, acetylene and oxygen supplied at the flow rates of 0.5, 1.6 and 1.5 normal liters, respectively, per minute, while the air-shielding gas stream 8 was of hydrogen supplied at the flow rate of 0.5 N liter per minute. The feather 7 had a diameter of 25 mm. The vessel 30 had a pressure reduced to 50 millibars. The reduced pressure was employed to promote the dissociation of the gaseous mixture and thereby produce active seeds for diamond having a high relative density. The substrate 3 was cooled to maintain a temperature of about 800° C. The film-forming operation was continued for an hour, whereby a homogeneous film of diamond having a thickness of 20 microns was formed in a circular area having a diameter of 25 mm.

The use of a reduced pressure was found to make it possible to form an enlarged flame and thereby a homogeneous film of diamond in an enlarged area without calling for any great reduction in the speed at which the film was formed. The reduced pressure was also found to enable the production of active seeds for diamond in a higher molar proportion.

EXAMPLE 3

The temperature of the substrate surface has a critical bearing on the quality of a film of diamond which is formed thereon. The use of a cooling holder which can directly cool the substrate is effective for restricting any undesirable variation in the temperature of the substrate surface and thereby ensuring the formation of a film of uniform quality.

Figure 4:
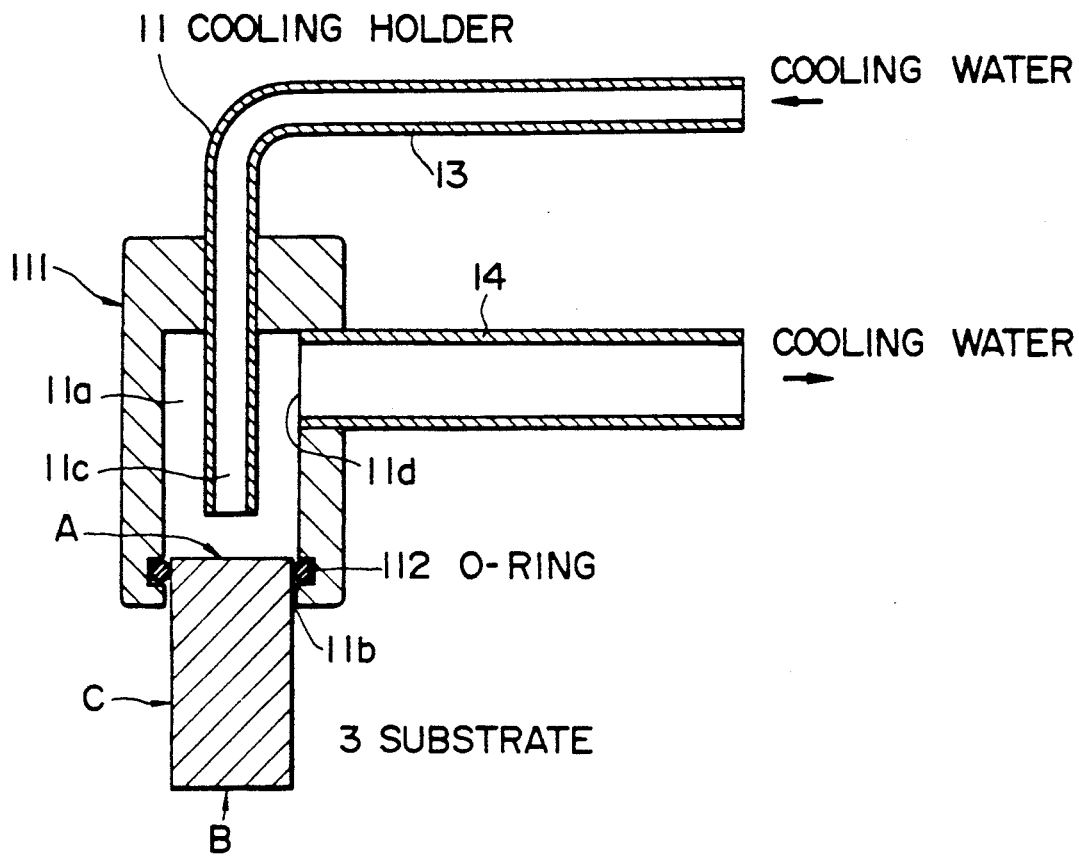
FIG. 4 is a schematic longitudinal sectional view of a cooling device which can be attached to the apparatus embodying this invention.

Attention is drawn to FIG. 4 showing by way of example a cooling holder which employs water for cooling the substrate. The cooling holder 11 comprises a main body 111 having a cylindrical bore 11a which is open at the bottom of the main body 111, and an annular sealing groove 11b formed in the inner peripheral surface of the main body 111 near the open end of the cylindrical bore 11a. An O-ring 112 is fitted in the sealing groove 11b. The substrate 3 has an upper end fitted in the cylindrical bore 11a and held by the 0-ring 112. The main body 111 is provided with a water introducing pipe 13 extending into the cylindrical bore 11a coaxially therewith and having a water outlet 11c located near the substrate 3, and a water discharging pipe 14 connected to the main body 111 and having a water inlet 11d which is open in the inner peripheral surface of the main body 111 at the upper end of the cylindrical bore 11a. Cold water is supplied through the pipe 13 and injected through its water outlet 11c into the bore 11a for cooling the upper end surface A of the substrate 3 directly, while the water which has been heated by cooling the substrate 3 rises and is discharged through the pipe 14, whereby the end surface A of the substrate 3 is maintained at a constant temperature.

The 0-ring 112 holds the substrate 3 removably against the main body 111 and keeps the substrate 3 from contacting the main body 111 to prevent the transfer of heat from the former to the latter, while providing, of course, a seal for the cooling water.

The temperature of the lower end surface B of the substrate 3, on which a film of diamond is formed, can be controlled by the cooling of its upper end surface A, and by the appropriate selection of the thickness of the substrate 3. The temperature of cooling water and its flow rate are so controlled as to maintain the upper end surface A of the substrate 3 at a temperature of about 20° C. to 25° C. The peripheral surface C of the substrate 3 is surrounded by recirculating combustion gas, but as air mixes with it, the combustion gas has a low temperature as compared with the flame temperature (30000K). Therefore, and also as the flame does not impinge upon the peripheral surface C, the amount of the heat entering the substrate 3 at its peripheral surface C is negligibly small, as compared with the heat of the flame entering it at its lower end surface B. It follows that the substrate 3 has a one-dimensional temperature distribution between its end surfaces A and B, i.e. has a temperature which drops substantially uniformly from its lower end surface B to its upper end surface A. Therefore, the temperature of the lower end surface B of the substrate 3 can be appropriately controlled by the cooling of its upper end surface A if the distance between the end surfaces A and B, or the thickness of the substrate 3, is appropriately selected.

The flow of heat into the substrate 3 at its lower end surface B depends on the substrate temperature, the flame (feather) temperature, and the flow velocity of the combustion gas. The lower end surface B of the substrate 3 has a higher temperature, as the substrate 3 has a greater thickness, and as the flame temperature becomes higher. If the surface B is held at a temperature of 800° C. to 900° C., it is possible to form a uniform film of diamond.

The substrate may be a cylindrical piece of molybdenum, may or may not be coated with e.g. silicon, and may have a diameter of 15 mm and a thickness or height of 30 mm.

The 0-ring 112 may be of a heat-resistant material withstanding the temperature of 220° C., and may keep a clearance of 0.2 mm between the substrate 3 and the main body 111 of the holder to prevent the transfer of heat from the substrate 3 to the main body 111 to restrict any undesirable elevation in temperature of the main body 111.

Figure 6:
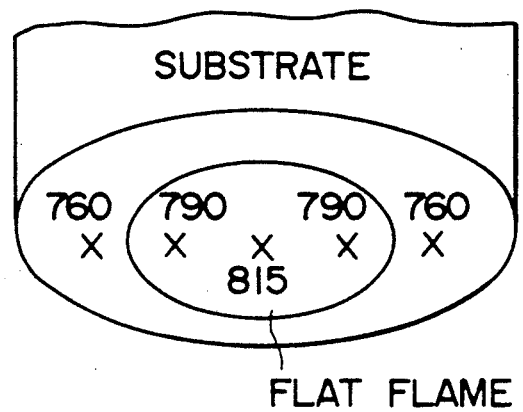
FIG. 6 is a view showing by way of example the temperature distribution as determined on the surface of a substrate on which a film is formed.
Figure 5:
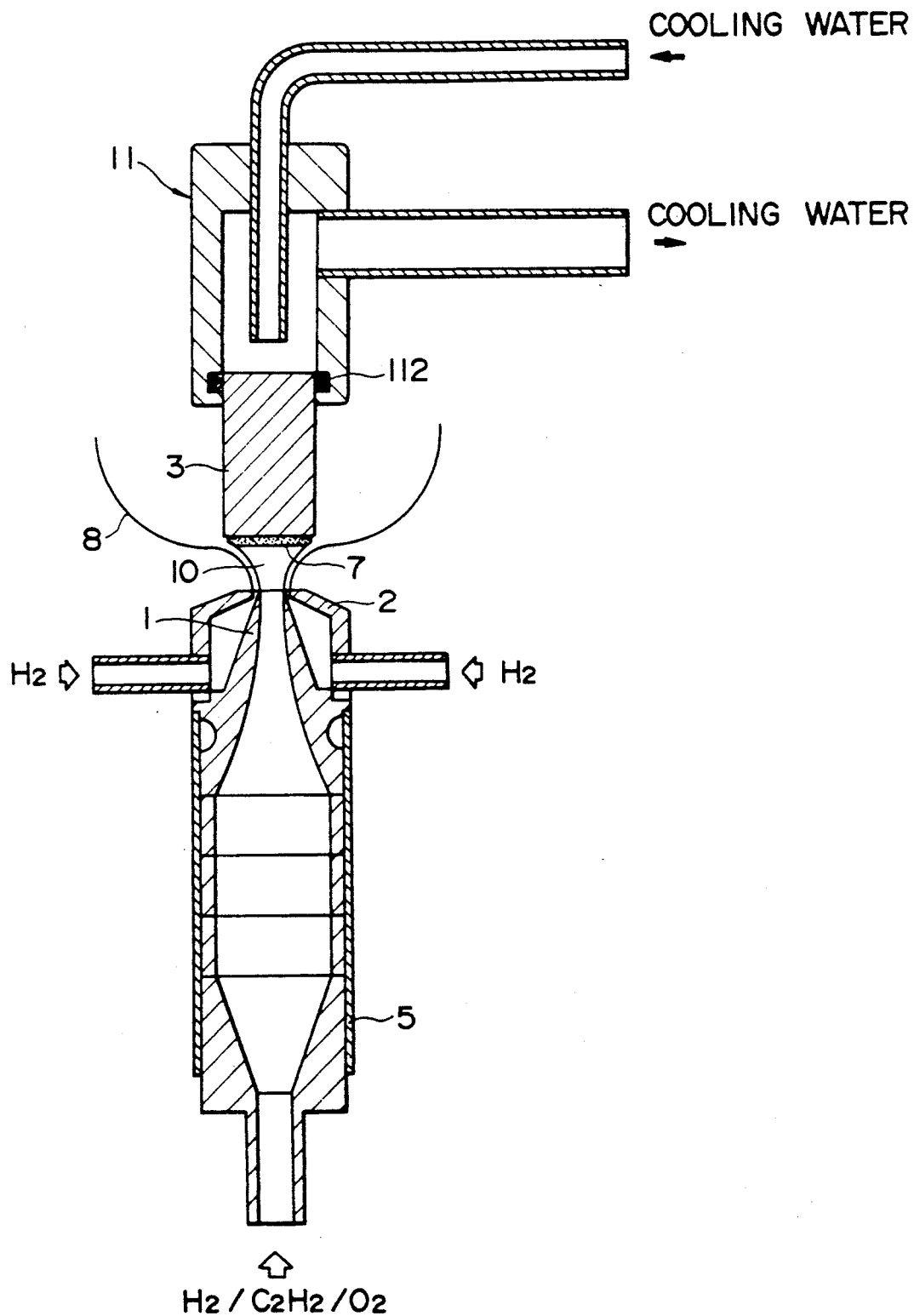
FIG. 5 is a schematic longitudinal sectional view of the apparatus embodying this invention and the cooling device attached to it.

Attention is now drawn to FIG. 5 showing an apparatus obtained by removing the holder 4 from the apparatus shown in FIG. 1, and employing the holder 11 shown in FIG. 4. This apparatus was used to form a film of diamond by repeating the conditions which had been employed in EXAMPLE 1. The temperature distribution of the lower end surface of the substrate 3 was measured by a radiation pyrometer. The results are shown in FIG. 6. As is obvious from it, the lower end surface of the substrate 3 had a temperature of 815° C. in the center of a flat flame (region) and a temperature of 760° C. in its peripheral portion surrounding the flat flame, which was about 50° C. lower than in the center of the flame. There was, however, a temperature difference of only about 20° C. between the center and edge of the flat flame region which had a diameter of 6 to 7 mm, and by which the uniform film was formed. It is obvious that the cooling holder 11 could keep any temperature difference across the film-forming area of the surface of the substrate 3 within the range of about 20° C. It was also confirmed that the absence of any undesirable variation in temperature of the substrate enabled a prolonged period of film-forming operation. Moreover, it was found that the substrate 3 could be reused if the diamond film which had been formed was removed from it.

The holder 11 was made of copper. The water introducing pipe 13 had an inside diameter of 6 mm and the water discharging pipe 14 had an inside diameter of 10 mm. The substrate 3 and the outlet 11c of the pipe 13 had a distance of 5 mm therebetween.

EXAMPLE 4

The apparatus shown in FIG. 7 and employed in EXAMPLE 3 was so modified as to permit the burner 20 to be horizontally moved to form a film of diamond in an enlarged area on the substrate 3. The burner 20 can be moved to move the flame along the substrate 3 without doing any harm to the film of diamond which has already been formed on it, since the combustible gas supplied through the auxiliary nozzle 2 to form the air-shielding gas stream 8 covering the substrate 3 consumes the oxygen of the surrounding air and thereby protects the existing film of diamond against oxidation.

The modified apparatus is shown in FIG. 7 and includes a movable supporting system 21 for the burner 20. The system 21 comprises a horizontal base 18, a slowly moving device 17 mounted horizontally slidably on the base 18, a driving unit 19 provided on one side of the system for moving the slowly moving device 17, and a supporting table 16 disposed horizontally on the top of the slowly moving device 17 for supporting the burner 20 at right angles to the lower surface of the substrate 3.

The driving unit 19 comprises a DC motor and a gear box, and when it is driven, the system 21 enables the burner 20 supported on the table 16 to move horizontally at a constant speed in the order of about 1 mm per minute, while remaining at right angles to the lower surface of the substrate 3 and maintaining a fixed distance from it. This enables the constant movement of the center of a flat flame along the lower surface of the substrate 3 and thereby the formation of a film of diamond in an enlarged area thereon.

The film-forming operation of EXAMPLE 3 was repeated and the system 21 was driven to move the burner 20 and thereby the center of the feather horizontally along the substrate 3. The substrate 3 had a diameter of 30 mm and the burner 20 was moved at a speed of 1 mm per minute, whereby a film of diamond having a thickness of about five microns was formed on the whole of the lower surface of the substrate 3.

EXAMPLE 5

The apparatus as hereinabove described with reference to FIG. 7 was so modified as to include a device for preventing any backfire in the burner 20, or extinguishing any backfire that might occur at the opening of the main nozzle 1, and preventing its propagation into the burner 20.

Figure 8:
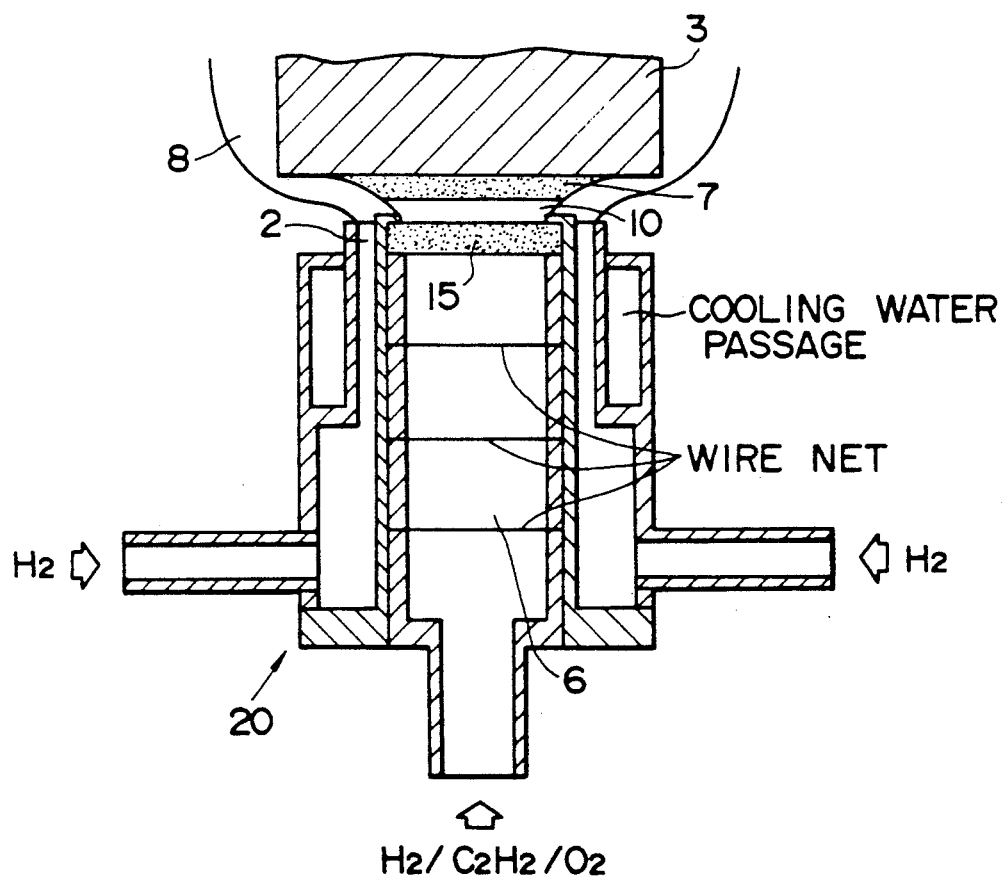
FIG. 8 is a schematic longitudinal sectional view of another apparatus embodying this invention and including a device for preventing backfire.

Reference is made to FIG. 8 showing a modified form of burner 20. The burner 20 comprises a cylindrical main nozzle 1 having a top opening and a damping chamber 6 defined below it, an auxiliary nozzle 2 surrounding the main nozzle 1 and defining an annular opening around it, a closed annular cooling water passage surrounding the auxiliary nozzle 2, a plurality of pipes connected radially to the auxiliary nozzle 2 for supplying it with a gas for forming an air-shielding gas stream 8, a pipe connected to the bottom of the damping chamber 6 for supplying it with a gaseous mixture for forming a main stream leaving the main nozzle 1, and a porous member 15 fitted in the top opening of the main nozzle 1 for preventing any backfire. The damping chamber 6 is provided with a plurality of a wire nets for rectifying the gaseous mixture before it leaves the main nozzle 1.

The porous member 15 is a plate-like member having a sufficiently large heat capacity for extinguishing any backfire that may occur, and having a sufficiently small and uniform pore diameter (not exceeding about 0.1 mm) for allowing the gaseous mixture to flow therethrough at a high and uniform rate without having any large pressure loss. More specifically, the porous member 15 may comprise, for example, a laminate of wire nets consisting of ones having a large mesh size, and ones having a small mesh size and so positioned as to face a flame, a sintered product of stainless steel, copper, nickel or other metal fibers having a porosity of 50 to 70%, a sintered product of a metal or ceramic powder, or a foamed product of a metal, such as stainless steel, copper or nickel, having a porosity of 30 to 50%, or a bundle of sintered metal vents or tubes having a multiplicity of small straight bores and a porosity of 20 to 40%, such as a bundle of stainless steel and copper tubes, or of iron and copper tubes.

Although the porous member 15 causes the gaseous mixture to flow in a stream lacking uniformity immediately after the outlet of the main nozzle 1, this problem thereafter disappears as a result of a reduction in the flow velocity of the gaseous mixture in a stagnant stream ahead of the substrate 3. Therefore, the porous member 15 does not hinder the formation of a homogeneous film of diamond.

The apparatus including the modified burner 20 was used to form a film of diamond. The main nozzle 1 had an inside diameter of 12 mm and an outside diameter of 18 mm. The porous member 15 was a sintered plate of copper having a diameter of 15 mm and a thickness of 2.5 mm. The auxiliary nozzle 2 had an outside diameter of 22 mm as measured across the outer circumference of the annular opening. The gaseous mixture to be injected through the porous member 15 is preferably at a flow rate of 20 to 40 meters per second.

In this Example, the gaseous mixture was of hydrogen supplied at a flow rate of 30 liters per minute, acetylene supplied at a flow rate of 65 liters per minute, and oxygen supplied at a flow rate of 60 liters per minute. The main nozzle 1 and the substrate 3 had a distance of 15 mm therebetween. The air-shielding gas stream 8 was of hydrogen supplied at a flow rate of 15 liters per minute. The film-forming operation was continued for an hour. Neither any flame extinction nor any backfire occurred. A uniform film of diamond could be formed.

The supporting table 16 for the burner 20 was moved horizontally at a speed of 4 mm per minute. As a result, an elongated film of diamond having a thickness of 5 microns was obtained. The slower, or reciprocative movement of the burner was found to enable the formation of a film having a greater thickness.

What is claimed is:

1. A method of forming a film of diamond on a surface of a substrate comprising:
    (a) forming a region of incomplete combustion contacting the surface of the substrate by burning a mixture of gases containing carbon, the region having a flame temperature of at least about 3000° K;
    (b) creating a stagnant flow ahead of said substrate, the flow having a reduced velocity as the mixture approaches the substrate;
    (c) stabilizing said region of incomplete combustion in the stagnant flow to be in a substantially flat shape relative to the surface of said substrate; and
    (d) maintaining the substrate at a sufficient temperature to form the film of diamond thereon.

2. A method as set forth in claim 1, wherein stabilizing said region is performed by the following steps;
    (a) homogenizing a flow velocity of said mixture across a plane perpendicular to said flow of said mixture; and
    (b) balancing the component of said uniform flow velocity in a direction perpendicular to said region and the burning velocity of said mixture upstream of said region.

3. A method as set forth in claim 2, wherein stabilizing said region is further performed by surrounding said flow of said mixture with an air-shielding gas stream.

4. A method as set forth in claim 2, wherein said flow velocity is homogenized by contracting and rectifying said flow of said mixture.

5. A method as set forth in claim 2, wherein said region is stabilizing by placing said stagnant flow in a reduced pressure atmosphere.

6. A method as set forth in claim 3, wherein said air-shielding gas stream comprises a combustible gas.

7. A method as set forth in claim 3, wherein said air-shielding gas stream comprises an inert gas.

8. A method as set forth in claim 3, wherein said mixture contains an additive which lowers the burning velocity of said mixture in said region.

9. A method as set forth in claim 8, wherein said mixture has a carbon and oxygen atom ratio by mole of 1.0 to 1.1.

10. A method as set forth in claim 8, wherein said mixture is of acetylene and oxygen and contains hydrogen as said additive.

11. A method as set forth in claim 8, wherein said mixture is of acetylene and oxygen and contains a hydrocarbon as said additive.

12. A method as set forth in claim 8, wherein said mixture is of acetylene and oxygen and contains a saturated hydrocarbon as said additive.

* * * * *